(12) United States Patent
Wang et al.

(10) Patent No.: US 11,282,799 B2
(45) Date of Patent: Mar. 22, 2022

(54) DEVICE FOR GENERATING SECURITY KEY AND MANUFACTURING METHOD THEREOF

(71) Applicant: UNITED MICROELECTRONICS CORP., Hsin-Chu (TW)

(72) Inventors: Wen-Lin Wang, Kaohsiung (TW); Ping-Chia Shih, Tainan (TW); Ming-Che Tsai, Tainan (TW); Kuei-Ya Chuang, Chiayi County (TW); Yi-Chun Teng, Taichung (TW); Po-Hsien Chen, Tainan (TW); Wan-Chun Liao, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 191 days.

(21) Appl. No.: 16/741,756

(22) Filed: Jan. 14, 2020

(65) Prior Publication Data

US 2021/0217708 A1    Jul. 15, 2021

(51) Int. Cl.
*H01L 23/00* (2006.01)
*H01L 27/088* (2006.01)
*H01L 21/768* (2006.01)
*H01L 21/8234* (2006.01)
*H01L 23/522* (2006.01)

(52) U.S. Cl.
CPC ...... *H01L 23/576* (2013.01); *H01L 21/76883* (2013.01); *H01L 21/823475* (2013.01); *H01L 23/5226* (2013.01); *H01L 27/088* (2013.01)

(58) Field of Classification Search
CPC ............ H01L 27/088; H01L 21/76883; H01L 21/823475; H01L 23/5226; H01L 23/576
See application file for complete search history.

(56) References Cited

U.S. PATENT DOCUMENTS

| | | | |
|---|---|---|---|
| 8,714,442 B2 | 5/2014 | Sharma | |
| 9,502,356 B1* | 11/2016 | Parvarandeh | ......... H01L 23/544 |
| 9,502,405 B1* | 11/2016 | Cao | ......... H01L 23/544 |
| 9,666,582 B1* | 5/2017 | Li | ......... H01L 21/823418 |
| 10,957,586 B2* | 3/2021 | Cao | ......... H01L 27/1203 |
| 2011/0096955 A1 | 4/2011 | Voloshynovskiy | |
| 2013/0101114 A1 | 4/2013 | Kim | |
| 2013/0233608 A1* | 9/2013 | Feng | ......... H01L 21/0274 174/264 |
| 2013/0322624 A1 | 12/2013 | Kim | |

(Continued)

*Primary Examiner* — Karen Kusumakar
*Assistant Examiner* — Adam S Bowen
(74) *Attorney, Agent, or Firm* — Winston Hsu (57) ABSTRACT

A device for generating a security key includes a substrate, semiconductor units, contact structures, and defects. The semiconductor units are disposed on the substrate. The contact structures are disposed on and connected with the semiconductor units. The defects are disposed in at least a part of the contact structures randomly. A manufacturing method of a device for generating a security key includes the following steps. First semiconductor units are formed on a substrate. First contact structures are formed on the first semiconductor units. The first contact structures are connected with the first semiconductor units, and defects are formed in at least a part of the first contact structures randomly.

18 Claims, 11 Drawing Sheets

(56) References Cited

U.S. PATENT DOCUMENTS

| | | | |
|---|---|---|---|
| 2014/0042627 A1* | 2/2014 | Edelstein | H01L 23/5226 257/758 |
| 2014/0203448 A1* | 7/2014 | Song | H01L 23/5384 257/774 |
| 2015/0207505 A1* | 7/2015 | Feng | H01L 27/088 257/392 |
| 2016/0170856 A1 | 6/2016 | Kim | |
| 2017/0077046 A1 | 3/2017 | Gupta | |
| 2017/0194356 A1* | 7/2017 | Cheng | H01L 21/3086 |
| 2018/0277198 A1* | 9/2018 | Tseng | G11C 7/1006 |
| 2019/0019766 A1* | 1/2019 | Hori | H01L 21/82 |

\* cited by examiner

DEVICE FOR GENERATING SECURITY KEY AND MANUFACTURING METHOD THEREOF

BACKGROUND OF THE INVENTION

1. Field of the Invention

The present invention relates to a device for generating a security key and a manufacturing method thereof, and more particularly, to a device including semiconductor units for generating a security key and a manufacturing method thereof.

2. Description of the Prior Art

There are many kinds of electronic equipment having identification keys and/or security keys stored therein for safely transmitting information from and/or toward the electronic equipment via encoding and decoding. However, different attacks tend to be carried out to the identification keys stored in electronic devices, and physical unclonable function (PUF) technology has been developed for identification keys and/or security keys with higher security.

The physical unclonable function may be regarded as a physically-defined digital fingerprint that serves as a unique identifier for an electronic device. The physical unclonable function may be formed by unique physical variations which occur during manufacturing processes. However, structural design and/or manufacturing methods of the physical unclonable function still has to be further modified for improving the randomness and/or other properties of the physical unclonable function.

SUMMARY OF THE INVENTION

A device for generating a security key and a manufacturing method thereof are provided in the present invention. Contact structures are formed on and connected with semiconductor units, and defects are disposed in at least a part of the contact structures randomly for forming a physical unclonable function.

According to an embodiment of the present invention, a device for generating a security key is provided. The device includes a substrate, semiconductor units, contact structures, and defects. The semiconductor units are disposed on the substrate. The contact structures are disposed on and connected with the semiconductor units. The defects are disposed in at least a part of the contact structures randomly.

According to another embodiment of the present invention, a manufacturing method of a device for generating a security key is provided. The manufacturing method includes the following steps. First semiconductor units are formed on a substrate. First contact structures are formed on the first semiconductor units. The first contact structures are connected with the first semiconductor units, and defects are formed in at least a part of the first contact structures randomly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-5 are schematic drawings illustrating a manufacturing method of a device for generating a security key according to a first embodiment of the present invention, wherein FIG. 4 is a schematic drawing in a step subsequent to FIG. 3 and FIG. 5 is a schematic drawing in a step subsequent to FIG. 4.

FIG. 8 and FIG. 9 are schematic drawings illustrating a manufacturing method of a device for generating a security key according to a second embodiment of the present invention, wherein FIG. 9 is a schematic drawing in a step subsequent to FIG. 8.

FIG. 10 and FIG. 11 are schematic drawings illustrating a manufacturing method of a device for generating a security key according to a third embodiment of the present invention, wherein FIG. 11 is a schematic drawing in a step subsequent to FIG. 10.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the related art that the present invention can also be employed in a variety of other applications.

It is noted that references in the specification to "one embodiment," "an embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

It should be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

It should be understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
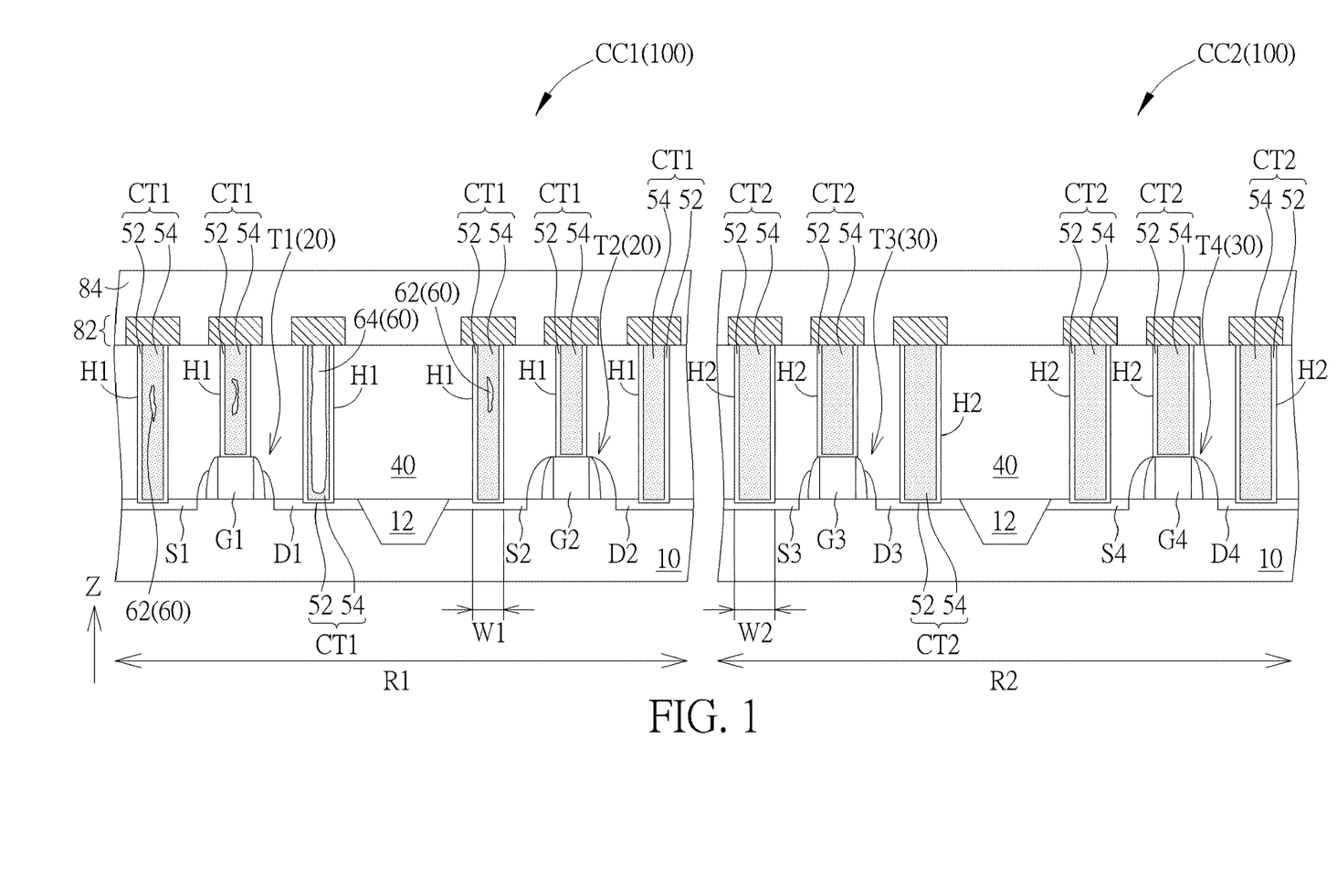
FIG. 1 is a schematic drawing illustrating a device for generating a security key according to an embodiment of the present invention.
Figure 2:
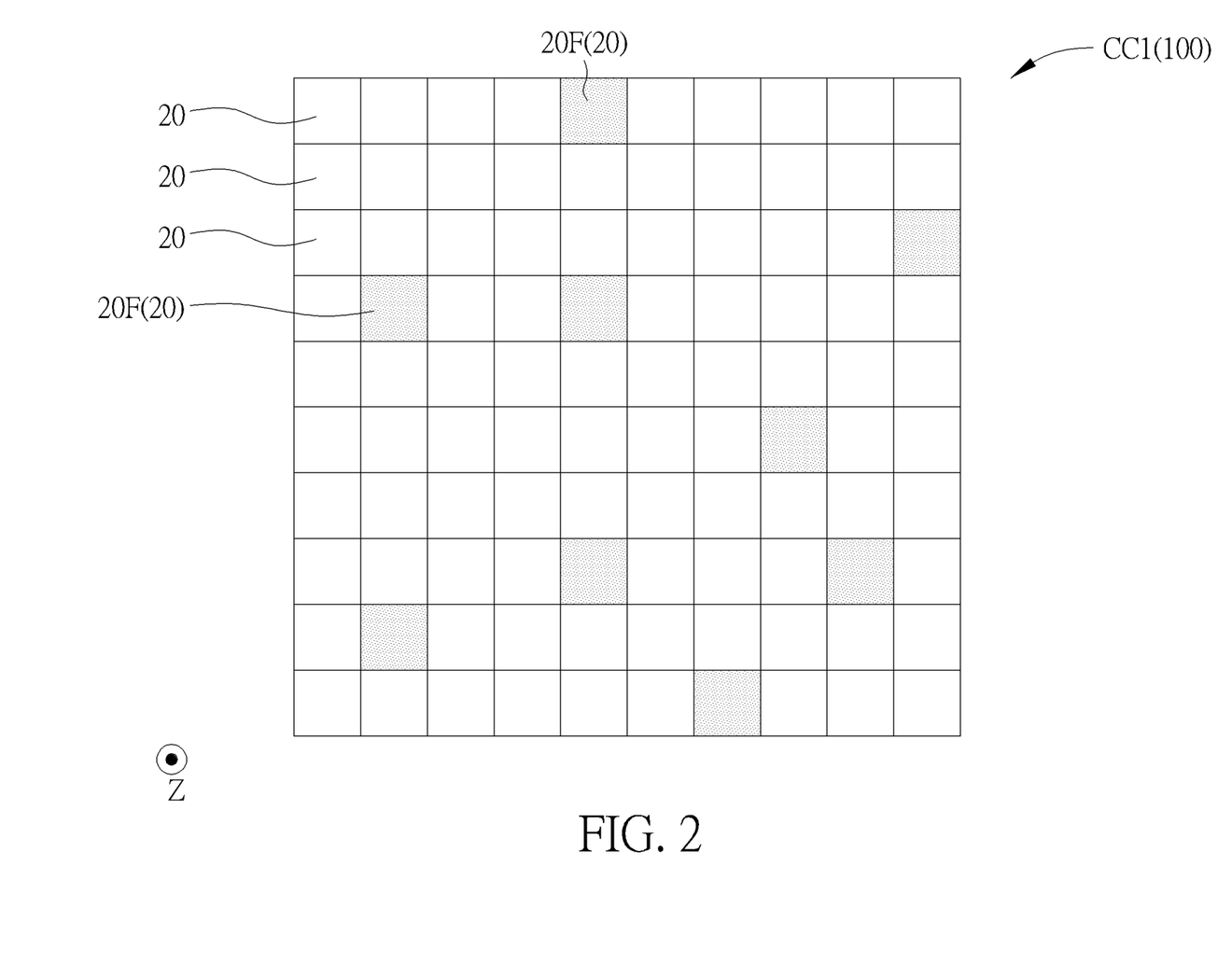
FIG. 2 is a schematic drawing illustrating a top view of a first circuit according to an embodiment of the present invention.

Please refer to FIG. 1 and FIG. 2. FIG. 1 is a schematic drawing illustrating a device for generating a security key according to an embodiment of the present invention. FIG. 2 is a schematic drawing illustrating a top view of a first circuit according to an embodiment of the present invention. As shown in FIG. 1, a device 100 for generating a security key is provided in this embodiment. The device 100 includes a substrate 10, semiconductor units (such as first semiconductor units 20 shown in FIG. 1), contact structures (such as first contact structures CT1 shown in FIG. 1), and defects 60. The first semiconductor units 20 are disposed on the substrate 10. The first contact structures CT1 are disposed on and connected with the first semiconductor units 20. The defects 60 are disposed in at least a part of the first contact structures CT1 randomly.

In some embodiments, the substrate 10 may include a semiconductor substrate, such as a silicon substrate, a silicon germanium semiconductor substrate, and a silicon-on-insulator (SOI) substrate, or a substrate made of other suitable materials. The first semiconductor units 20 may be at least partially disposed on the substrate 10. In some embodiments, the first semiconductor units 20 may include transistors (such as a transistor T1 and a transistor T2 shown in FIG. 1), and the device 100 may further include an isolation structure 12 disposed in the substrate 10 for isolating the transistors from one another. The isolation structure 12 may include a single layer or multiple layers of insulation materials, such as silicon oxide, silicon nitride, or other suitable insulation materials. Each of the transistors may include a gate electrode, a source region, and a drain region, but not limited thereto. For instance, the transistor T1 may include a gate electrode G1, a source region S1, and a drain region D1, and the transistor T2 may include a gate electrode G2, a source region S2, and a drain region D2. In some embodiments, the source region S1, the drain region D1, the source region S2, and the drain region D2 may include doped regions disposed in the substrate 10, and the gate electrode G1 and the second gate electrode G2 may include a conductive gate material and a gate dielectric layer disposed between the conductive gate material and the substrate 10 in a thickness direction Z of the substrate 10, but not limited thereto. In some embodiments, the conductive gate material may include a non-metallic conductive gate material, such as polysilicon, a metallic conductive gate material, or suitable conductive materials, and the gate dielectric layer may include an oxide layer, such as a silicon oxide layer, or other suitable dielectric materials, such as high dielectric constant (high-k) dielectric materials.

In some embodiments, a conductivity type of the transistor T1 may be different from a conductivity type of the transistor T2, but not limited thereto. For example, the transistor T1 may be an N-type transistor and the transistor T2 may be a P-type transistor in some embodiments. Therefore, the conductivity type of the source region S1 and the drain region D1 may be different from the conductivity type of the source region S2 and the drain region D2, a material composition of the gate electrode G1 may be different from a material composition of the gate electrode G2, and/or a spacer structure formed on a sidewall of the gate electrode G1 may be different from a spacer structure formed on a sidewall of the gate electrode G2, but not limited thereto. In some embodiments, the conductivity types of the transistors in the first semiconductor units 20 may be the same, and the structures of the transistors in the first semiconductor units 20 may be identical to one another according to some design considerations. In addition, the device 100 may further include a first dielectric layer 40 disposed on the substrate 10 and covering the first semiconductor units 20. The first dielectric layer 40 may include a single layer or multiple layers of insulation materials, such as silicon oxide, silicon nitride, or other suitable insulation materials.

Each of the first contact structures CT1 may penetrate the first dielectric layer 40 in the thickness direction Z of the substrate 10 for being connected to the corresponding portion of the first semiconductor unit 20. For instance, one of the first contact structures CT1 may penetrate the first dielectric layer 40 above the gate electrode (such as the gate electrode G1 or the gate electrode G2) of the first semiconductor unit 20 for being disposed on and connected with the gate electrode, one of the first contact structures CT1 may penetrate the first dielectric layer 40 above the source region (such as the source region S1 or the source region S2) of the first semiconductor unit 20 for being disposed on and connected with the source region, and one of the first contact structures CT1 may penetrate the first dielectric layer 40 above the drain region (such as the drain region D1 or the drain region D2) of the first semiconductor unit 20 for being disposed on and connected with the drain region.

In other words, each of the first contact structures CT1 may be disposed on one of the gate electrodes, one of the source regions, or one of the drain regions described above. In some embodiments, each of the first contact structures CT1 may directly contact one of the gate electrodes, one of the source regions, or one of the drain regions. In some embodiments, a conductive silicide layer (not shown) may be formed between the first contact structure CT1 and the corresponding gate electrode, between the first contact structure CT1 and the corresponding source region, and/or between the first contact structure and the corresponding drain region for reducing contact resistance between the first contact structure CT and the corresponding portion of the first semiconductor unit 20.

In some embodiments, each of the first contact structures CT1 may include a conductive material (such as a first conductive material 52 and a second conductive material 54 shown in FIG. 1), and the defects 60 may be disposed in the conductive material. In some embodiments, the first conductive material 52 may include a conductive barrier layer, and the second conductive material 54 may include a low resistance material surrounded by the conductive barrier layer, but not limited thereto. The low resistance material described above may include materials with relatively lower electrical resistivity, such as copper, aluminum, and tungsten, and the conductive barrier layer described above may include titanium nitride, tantalum nitride, or other suitable barrier materials, but not limited thereto. In some embodiments, the defects 60 may include a first defect 62 and a second defect 64, and a size of the second defect 64 may be larger than a size of the first defect 62. For example, the first defect 62 may include a seam defect disposed in the second conductive material 54, and the second defect 64 may include an air void disposed in the first contact structure CT1, but not limited thereto. In some embodiments, there is not any defect 60 formed in some of the first contact structures CT1, and each of the defects 60 may include an air void disposed in one of the first contact structures CT1 randomly. In the first contact structure CT where the second defect 64 is disposed, a part of the first conductive material 52 and/or a part of the second conductive material 54 may be disposed between the second defect 64 and the corresponding first semiconductor unit 20 in the thickness direction Z of the substrate 10. In other words, at least a part of the conductive materials of the first contact structures CT1 may be disposed between one of the air voids (such as the second defects 64) and one of the first semiconductor units 20 in the thickness direction Z of the substrate 10.

In some embodiments, the device 100 may further include a conductive layer 82 and a second dielectric layer 84. The conductive layer 82 may be disposed in the second dielectric layer 84 and disposed above the first contact structures CT1. The conductive layer 82 may include a low resistance material and a barrier layer, and the second dielectric layer 84 may include silicon oxide, silicon nitride, silicon carbonitride, fluorosilicate glass (FSG), low dielectric constant (low-k) material or other suitable dielectric materials. The low resistance material described above may include materials with relatively lower electrical resistivity, such as copper, aluminum, and tungsten, and the barrier layer described above may include titanium nitride, tantalum nitride, or other suitable barrier materials, but not limited thereto. In some embodiments, the conductive layer 82 may be may be physically and electrically connected with the first contact structures CT1, and the first semiconductor units 20, the first contact structures CT1, the defects 60, and the conductive layer 82 may constitute a first circuit CC1.

As shown in FIG. 1 and FIG. 2, in some embodiments, the device 100 may include a plurality of the first semiconductor units 20 arranged in an array configuration, but not limited thereto. The defect 60 (especially the second defect 64) disposed in the first contact structure CT1 will influence the function of the first contact structure CT1. For example, the electrical connection between the conductive layer 82 and the first semiconductor unit 20 may fail when the defect 60 is disposed in at least one of the first contact structures CT1 connected to this first semiconductor unit 20. Therefore, after transmitting signals towards the first semiconductor units 20 in the first circuit CC1, each of the first semiconductor units 20 in the first circuit CC1 may be determined to be normal or abnormal by analyzing the feedback of each of the first semiconductor units 20. The first semiconductor unit 20 may be determined to be an abnormal unit 20F when the defect 60 is disposed in at least one of the first contact structures CT1 connected to this first semiconductor unit 20. The abnormal units 20F may be randomly distribute in the first circuit CC1 because the defects 60 are disposed in at least a part of the first contact structures CT1 randomly. The random distribution of the abnormal units 20F in the first circuit CC1 may be used as digital biometrics and/or a digital fingerprint that serves as a unique identifier for an electronic device including the device 100. Accordingly, the defects 60 and/or the first semiconductor units 20 including the abnormal units 20F may be used as a physical unclonable function (PUF), and the first circuit CC1 may be regarded as a PUF circuit and/or an encryption key circuit for generating a security key and/or an identification key with suitable algorithm.

In some embodiments, the first semiconductor units 20 may be arranged in an array configuration for generating a matrix of feedback value from the first semiconductor units 20, but not limited thereto. In some embodiments, the first semiconductor units 20 may be arranged in other suitable configurations according to some design considerations. In some embodiments, different variation levels in the feedbacks from the abnormal units 20F may be identified for generating a more complicated security key, but not limited thereto. For instance, the feedback from the first semiconductor unit 20 with more than one defects 60 disposed in the first contact structures CT1 may be different from the feedback from the first semiconductor unit 20 with only one defect 60 disposed in the first contact structure CT1, and the feedback from the first semiconductor unit 20 with a relatively lager defect 60 disposed in the first contact structure CT1 may be different from the feedback from the first semiconductor unit 20 with a relatively smaller defect 60 disposed in the first contact structure CT1, but not limited thereto.

As shown in FIG. 1, in some embodiments, the device 100 may further include a plurality of second semiconductor units 30 and a plurality of second contact structures CT2. A first region R1 and a second region R2 may be defined on the substrate 10, the first circuit CC1 described above may be disposed on the first region R1, and the second semiconductor units 30 and the second contact structures CT2 may be disposed on the second region R2 of the substrate 10. The first dielectric layer 40 may further cover the second semiconductor units 30, and the second contact structures CT2 may disposed in the first dielectric layer 40 above the second region R2. In some embodiments, the second semiconductor units 30 may include transistors (such as a transistor T3 and a transistor T4 shown in FIG. 1), and a part of the isolation structure 12 may be disposed between the transistors for isolating the transistors from one another. Each of the transistors in the second semiconductor units 30 may include a gate electrode, a source region, and a drain region, but not limited thereto. For instance, the transistor T3 may include a gate electrode G3, a source region S3, and a drain region D3, and the transistor T4 may include a gate electrode G4, a source region S4, and a drain region D4. In some embodiments, the gate electrode G3, the source region S3, and the drain region D3 may be similar to the gate electrode G1, the source region S1, and the drain region D1 respectively, and the gate electrode G4, the source region S4, and the drain region D4 may be similar to the gate electrode G2, the source region S2, and the drain region D2 respectively, but not limited thereto.

Each of the second contact structures CT2 may penetrate the first dielectric layer 40 in the thickness direction Z of the substrate 10 for being connected to the corresponding portion of the second semiconductor unit 30. For instance, one of the second contact structures CT2 may penetrate the first dielectric layer 40 above the gate electrode (such as the gate electrode G3 or the gate electrode G4) of the second semiconductor unit 30 for being disposed on and connected with the gate electrode, one of the second contact structures CT2 may penetrate the first dielectric layer 40 above the source region (such as the source region S3 or the source region S4) of the second semiconductor unit 30 for being disposed on and connected with the source region, and one of the second contact structures CT2 may penetrate the first dielectric layer 40 above the drain region (such as the drain region D3 or the drain region D4) of the second semiconductor unit 30 for being disposed on and connected with the drain region. In some embodiments, each of the second contact structures CT2 may include the first conductive material 52 and the second conductive material 54 described above, but not limited thereto. Additionally, a part of the conductive layer 82 may be disposed on the second contact structures CT2 for being physically and electrically connected with the second contact structures CT2, and the second semiconductor units 30, the second contact structures CT2, and the part of the conductive layer 82 may constitute a second circuit CC2 different from the first circuit CC1 described above.

In some embodiments, there may be not any defect 60 disposed in the second contact structures CT2, and the second circuit CC2 may be regarded as a circuit for normal functions, such as a logic circuit, but not limited thereto. In other words, a density of the defects 60 on the first region R1 may be much higher than a density of the defects 60 on the second region R2, and the density of the defects 60 may be defined as the amounts of the defects 60 per unit area above the substrate 10. The first region R1 may be regarded as a PUF region and the second region R2 may be regarded as a logic region, but not limited thereto. In some embodiments, some of the first defects 62 may be formed in some of the second contact structures CT2, and the first defects 62 may be repaired by some treatments while the second defects 64 cannot be repaired by these treatments, but not limited thereto. Therefore, the second defects 64 may be used to form the physical unclonable function described above. In some embodiments, the dimension of each of the second contact structures CT2 may be different from the dimension of each of the first contact structures CT1 for avoiding forming the defects 60 in the second contact structures CT2. For example, a width W2 of each of the second contact structures CT2 may be larger than a width W1 of each of the first contact structures CT1, but not limited thereto. In some embodiments, the dimension of each of the second contact structures CT2 may be substantially identical to the dimension of each of the first contact structures CT1, and the defects 60 may be kept form being formed in the second contact structures CT2 by other approaches.

Figure 3:
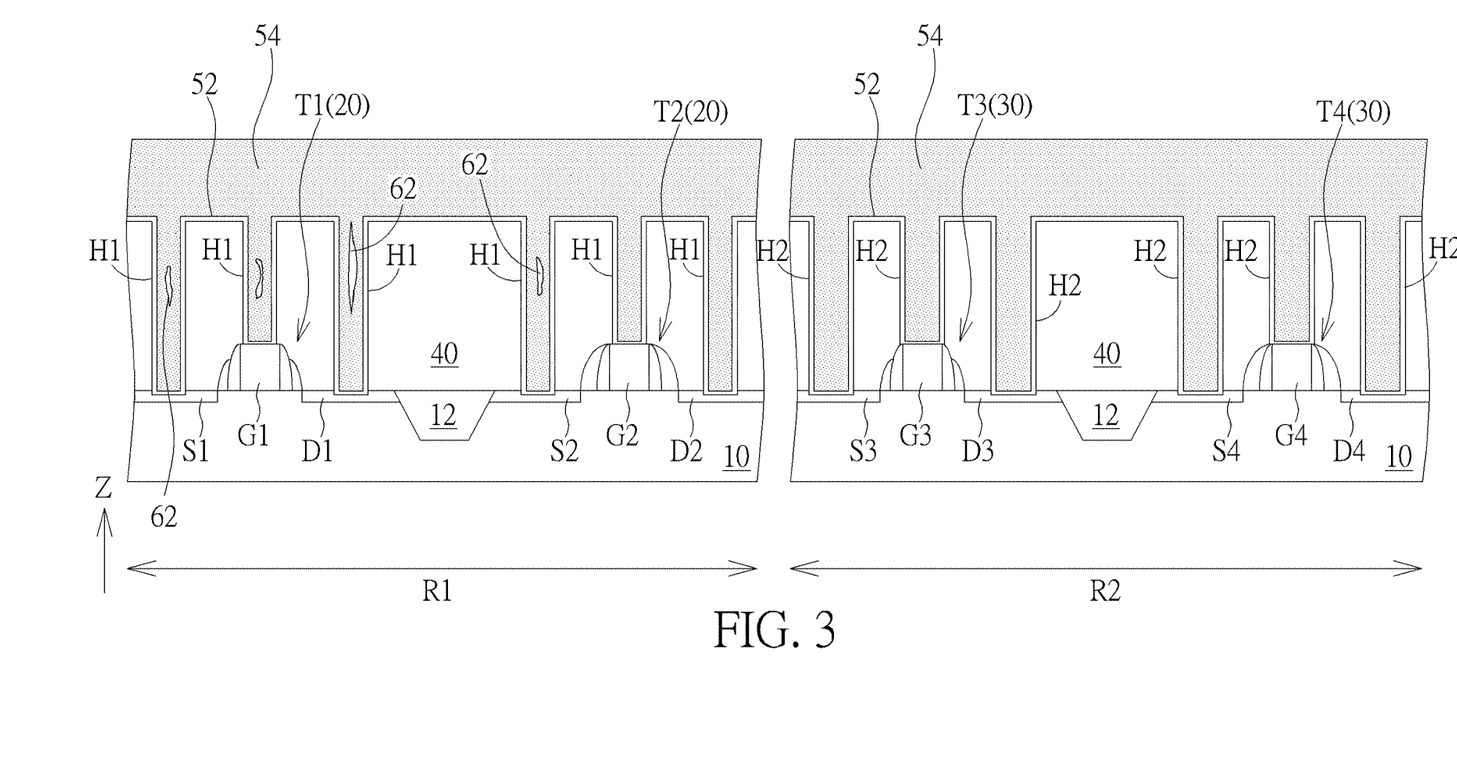
Figure 4:
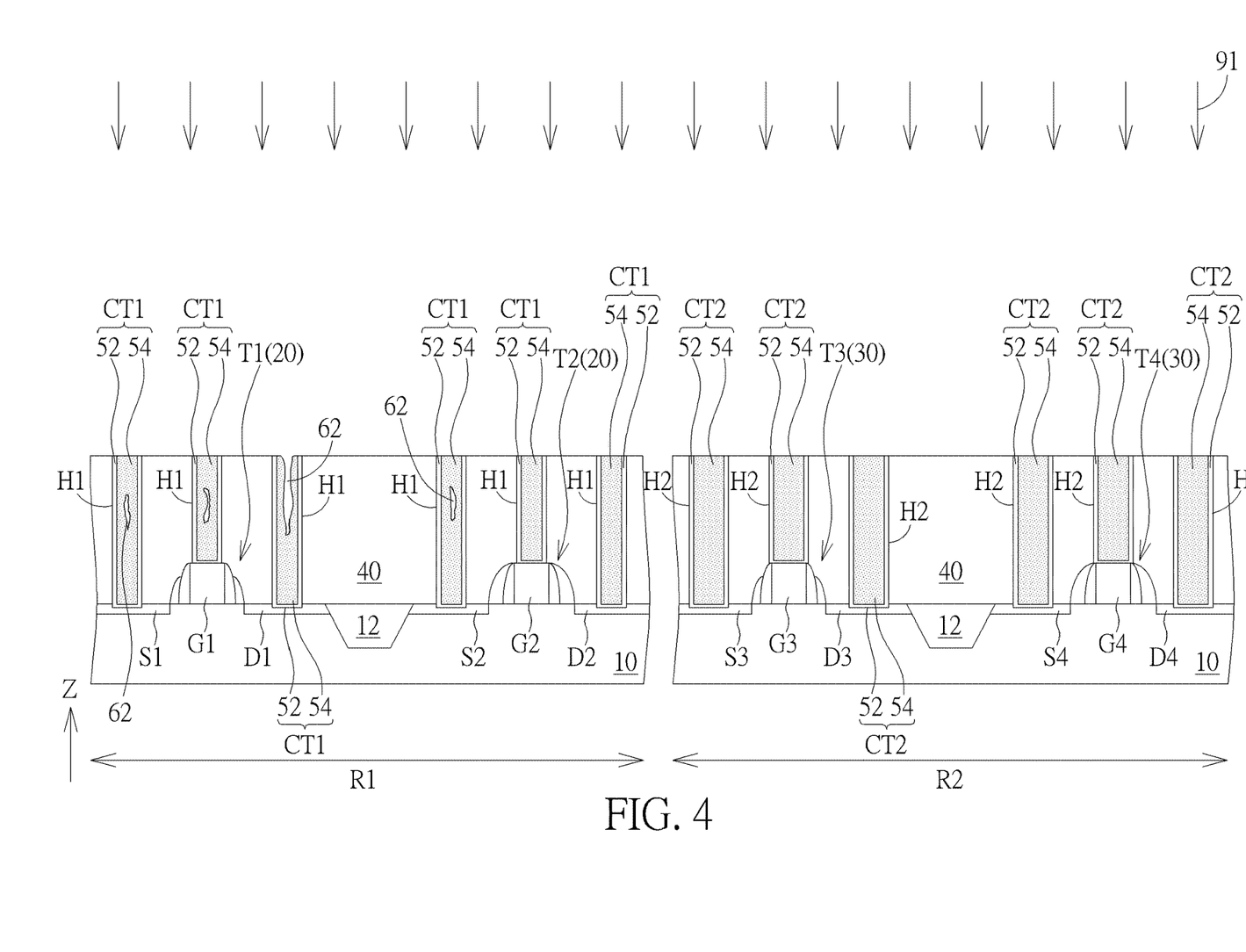
Figure 5:
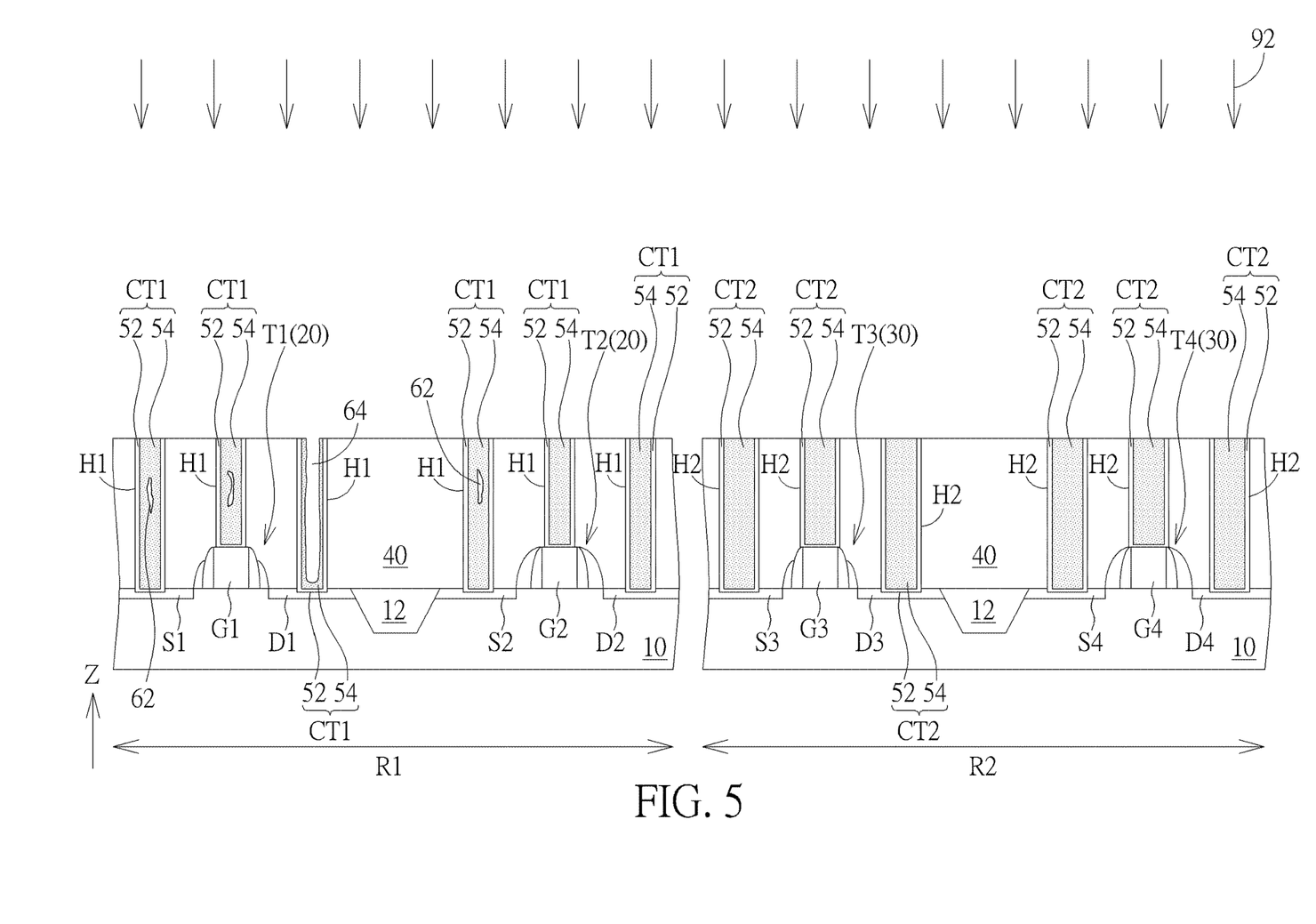

Please refer to FIG. 1 and FIGS. 3-5. FIGS. 3-5 are schematic drawings illustrating a manufacturing method of the device for generating the security key according to a first embodiment of the present invention. FIG. 4 is a schematic drawing in a step subsequent to FIG. 3, FIG. 5 is a schematic drawing in a step subsequent to FIG. 4, and FIG. 1 may be regarded as a schematic drawing in a step subsequent to FIG. 5. As shown in FIG. 1, the manufacturing method of the device for generating the security key may include the following steps. The first semiconductor units 20 may be formed on the substrate 10, and the first contact structures CT1 may be formed on the first semiconductor units 20. The first contact structures CT1 are connected with the first semiconductor units 20, and the defects 60 are formed in at least a part of the first contact structures CT1 randomly. In some embodiments, the manufacturing method may further include forming the second semiconductor units 30 on the substrate 10 and forming the second contact structures CT2 on the second semiconductor units 30, and the second contact structures CT2 may be connected with the second semiconductor units 30, but not limited thereto. Each of the first contact structures CT1 may be formed on one of the gate electrodes of the first semiconductor units 20, one of the source regions of the first semiconductor units 20, or one of the drain regions of the first semiconductor units 20, and each of the second contact structures CT2 may be formed on one of the gate electrodes of the second semiconductor units 30, one of the source regions of the second semiconductor units 30, or one of the drain regions of the second semiconductor units 30. In some embodiments, the first contact structures CT1 may be formed in first contact holes H1 penetrating the first dielectric layer 40 above the first region R1 respectively, and the second contact structures CT2 may be formed in second contact holes H2 penetrating the first dielectric layer 40 above the second region R2 respectively.

As shown in FIG. 1 and FIGS. 3-5, the manufacturing method may include but is not limited to the following steps. As shown in FIG. 3, the first dielectric layer 40 is formed covering the first semiconductor units 20 and the second semiconductor units 30. The first contact holes H1 may be formed penetrating the first dielectric layer 40 above the first region R1 in the thickness direction Z of the substrate 10, and the second contact holes H2 may be formed penetrating the first dielectric layer 40 above the second region R2 in the thickness direction Z of the substrate 10. In some embodiments, the first contact holes H1 and the second contact holes H2 may be formed concurrently by the same process, such as a patterning process, but not limited thereto. In some embodiments, the patterning process may include a photolithography process using a photomask. In some embodiments, the first contact holes H1 and the second contact holes H2 may also be formed separately and/or formed by other suitable approaches. Subsequently, the conductive material (such as the first conductive material 52 and the second conductive material 54) for forming the first contact structures CT1 and the second contact structures CT2 described above may be partly formed in the first contact holes H1, partly formed in the second contact holes H2, and partly formed outside the first contact holes H1 and the second contact holes H2.

As shown in FIG. 3 and FIG. 4, a planarization process 91 may be performed to the first conductive material 52 and the second conductive material 54 for removing the first conductive material 52 outside the first contact holes H1 and the second contact holes H2, removing the second conductive material 54 outside the first contact holes H1 and the second contact holes H2, and forming the first contact structures CT1 and the second contact structures CT2 concurrently. In some embodiments, the planarization process 91 may include a chemical mechanical polishing (CMP) process, an etching back process, or other suitable planarization approaches. It is worth noting that the first defects 62 may be formed in at least some of the first contact structures CT1 before the planarization process 91, and some of the first defects 62 may be exposed by the planarization process 91. In some embodiments, the first defects 62 may be generated by the process of forming the second conductive material 54 when the first conductive material 52 is formed conformally on the inner surfaces of the first contact holes H1 and the second contact holes H2 and the second conductive material 54 is subsequently formed on the first conductive material for filling the first contact holes H1 and the second contact holes H2. The first defects 62 tend to be generated especially when the aspect ratio of the contact hole is relatively high. Therefore, a dimension of each of the first contact holes H1 may be smaller than a dimension of each of the second contact holes H2 for forming the first defects 62 in at least some of the first contact holes H1 and avoiding forming the first defects 62 in the second contact holes H2, but not limited thereto. In some embodiments, the process parameters of the step of forming the second conductive material 54 (such as deposition rate) and/or the dimension of each of the first contact holes H1 may be modified for forming the first defects 62 in at least a part of the first contact holes H1 randomly.

As shown in FIG. 4 and FIG. 5, a first cleaning process 92 may be performed after the planarization process 91 for removing byproducts and/or residues generated by the planarization process 91. In some embodiments, the first defect 62 exposed by the planarization process 91 may be converted into the second defect 64 by the first cleaning process 92 because the surface area of the second conductive material 54 directly contacting the chemical used in the first cleaning process 92 may be increased by the first defect 62, and a seam defect may become an air void in the second conductive material 54 accordingly. In some embodiments, the first cleaning process 92 may include a buffered oxide etch (BOE) cleaning process (which may use ammonium fluoride ($NH_4F$) and hydrofluoric acid (HF) as etchants, but not limited thereto) or a cleaning process using other suitable chemicals. As shown in FIG. 5 and FIG. 1, the conductive layer 82 and the second dielectric layer 84 may be formed above the first contact structures CT1, the second contact structures CT2, and the first dielectric layer 40 after the first cleaning process 92. In some embodiments, each of the defects 60 may include an air void formed in one of the first contact structures CT1 randomly, and a part of the first conductive material 52 and/or a part of the second conductive material 54 may be located between the air void and the corresponding first semiconductor unit 20 in the thickness direction Z of the substrate 10 because the air void is formed from the seam defect in the second conductive material 54.

Figure 6:
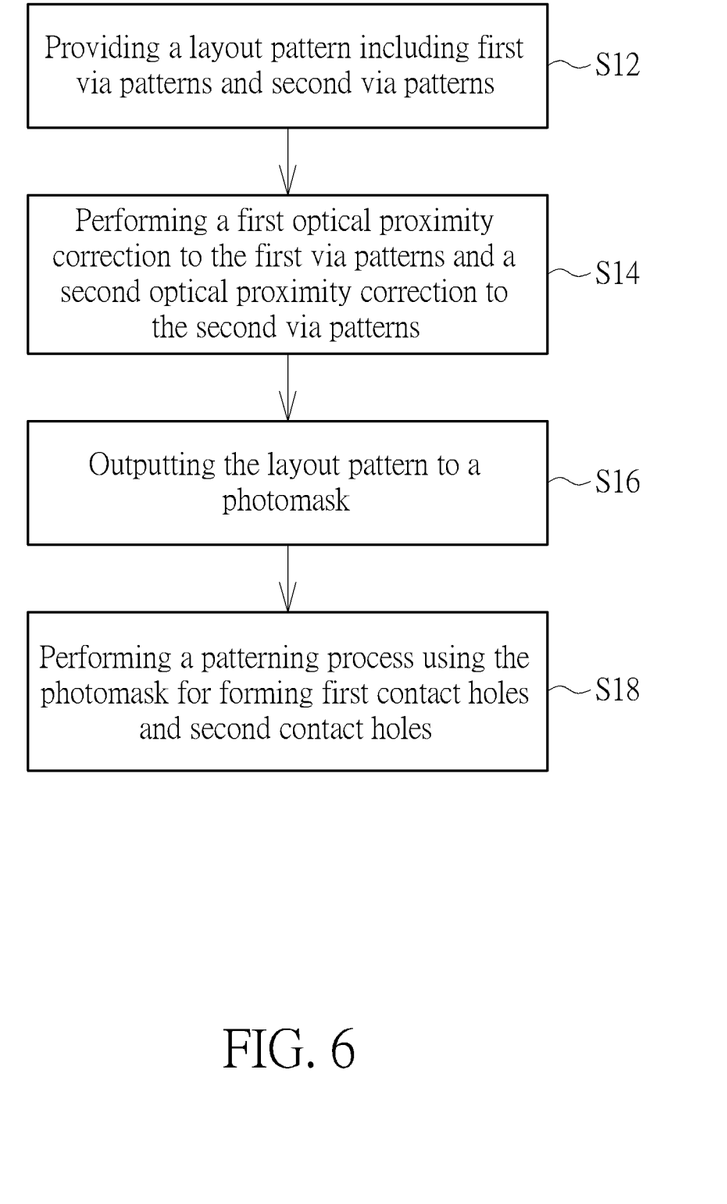
FIG. 6 is a flow chart of a method of forming first contact holes and second contact holes according to an embodiment of the present invention.
Figure 7:
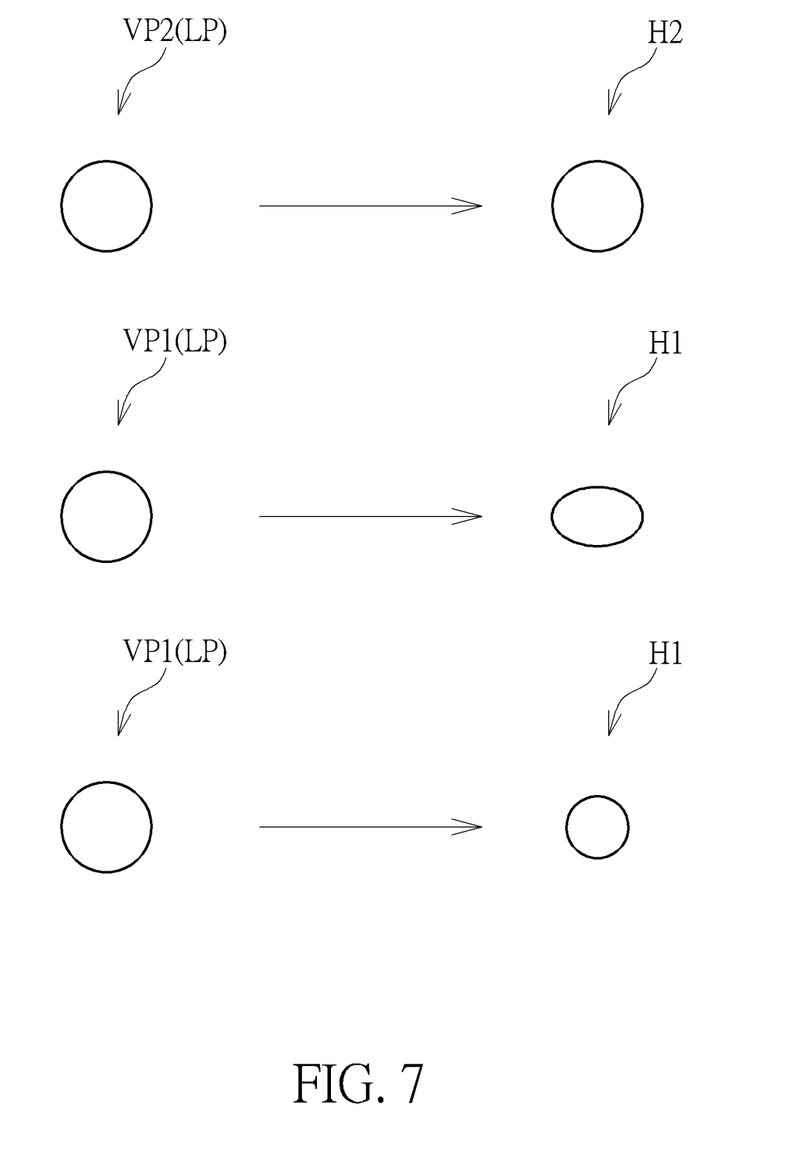
FIG. 7 is a schematic drawing illustrating comparisons between the first contact hole, the second contact hole, a first via pattern in a layout pattern, and a second via pattern in the layout pattern.

Please refer to FIG. 1, FIG. 6, and FIG. 7. FIG. 6 is a flow chart of a method of forming the first contact holes H1 and the second contact holes H2 according to an embodiment of the present invention. FIG. 7 is a schematic drawing illustrating comparisons between the first contact hole H1, the second contact hole H2, a first via pattern VP1 in a layout pattern LP, and a second via pattern VP2 in the layout pattern LP. The first contact hole H1 and the second contact hole H2 shown in FIG. 7 may be regarded as a projection pattern of the first contact hole H1 and projection patterns of the second contact holes H2 in the thickness direction Z of the substrate 10. As shown in FIG. 1, FIG. 6 and FIG. 7, a method for forming the first contact holes H1 and the second contact holes H2 may include but is not limited to the following steps. In step S12, a layout pattern LP including first via patterns VP1 corresponding to the first contact holes H1 and second via patterns VP2 corresponding to the second contact holes H2 may be provided. The first via patterns VP1 are used to form the first contact holes, and the second via patterns VP2 are used to form the second contact holes H2. In step S14, a first optical proximity correction (OPC) may be performed to the first via patterns VP1, a second OPC may be performed to the second via patterns VP2, and the first OPC is different from the second OPC. In some embodiments, each of the first via patterns VP1 may be identical to each of the second via patterns VP2 before the first OPC and the second OPC, and each of the first via patterns VP1 may be different from each of the second via patterns VP2 after the first OPC and the second OPC. In other word, the first OPC may be used to change the shape of each of the first via patterns VP1 for forming the required shape of each first contact hole H1 while the original first via pattern VP1 may be identical to the original second via pattern VP2 in the layout pattern LP for simplifying the design of the layout pattern LP, but not limited thereto. In some embodiments, each of the first via patterns VP1 may be different from each of the second via patterns VP2 before optical proximity corrections.

In step S16, after the first OPC and the second OPC, the layout pattern LP including the first via patterns VP1 and the second via patterns VP2 may be output to a photomask, and a patterning process (such as the photolithography process described above) using this photomask may be performed for forming the first contact holes H1 and the second contact holes H2 in step S18. In some embodiments, a projection shape of each of the second contact holes H2 in the thickness direction Z of the substrate 10 (such as the pattern marked with H2 in FIG. 7) may be similar to the second via pattern VP2 before the second OPC, and a projection shape of each of the first contact holes H2 in the thickness direction Z of the substrate 10 (such as the upper pattern marked with H1 in FIG. 7) may be different from the first via pattern VP1 before the first OPC. Therefore, in some embodiments, the projection shape of each of the first contact holes H1 in the thickness direction Z of the substrate 10 may be different from the projection shape of each of the second contact holes H2 in the thickness direction Z of the substrate 10 for forming the defects 60 in at least some of the first contact holes H1 and avoiding forming the defect 60 in the second contact holes H2, but not limited thereto. In some embodiments, a projection area of each of the first contact holes H1 in the thickness direction Z of the substrate 10 (such as the lower pattern marked with H1 in FIG. 7) may be smaller than a projection area of each of the second contact holes H2 in the thickness direction Z of the substrate 10 for forming the defects 60 in at least some of the first contact holes H1 and avoiding forming the defect 60 in the second contact holes H2, but not limited thereto.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 8:
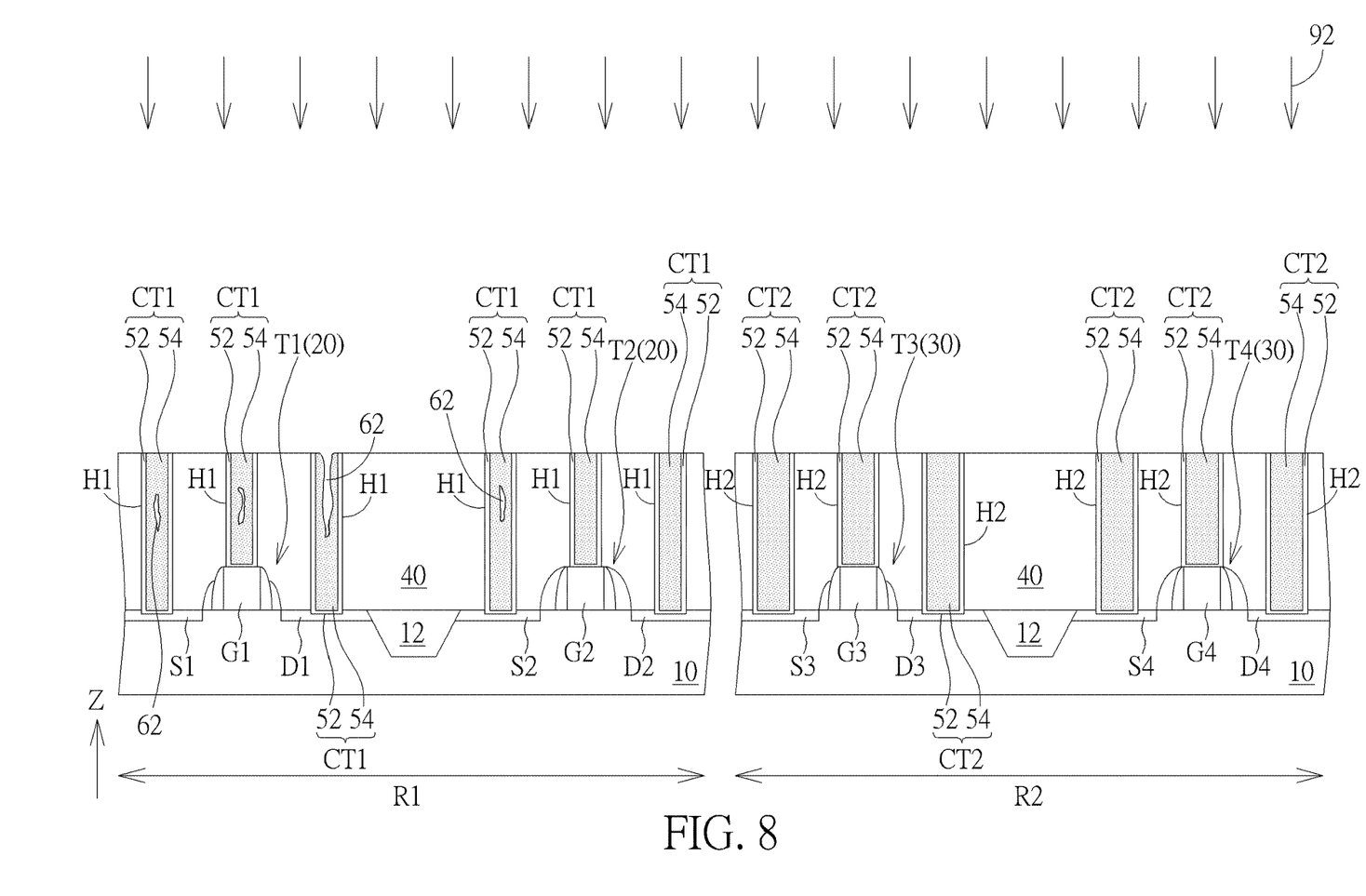
Figure 9:
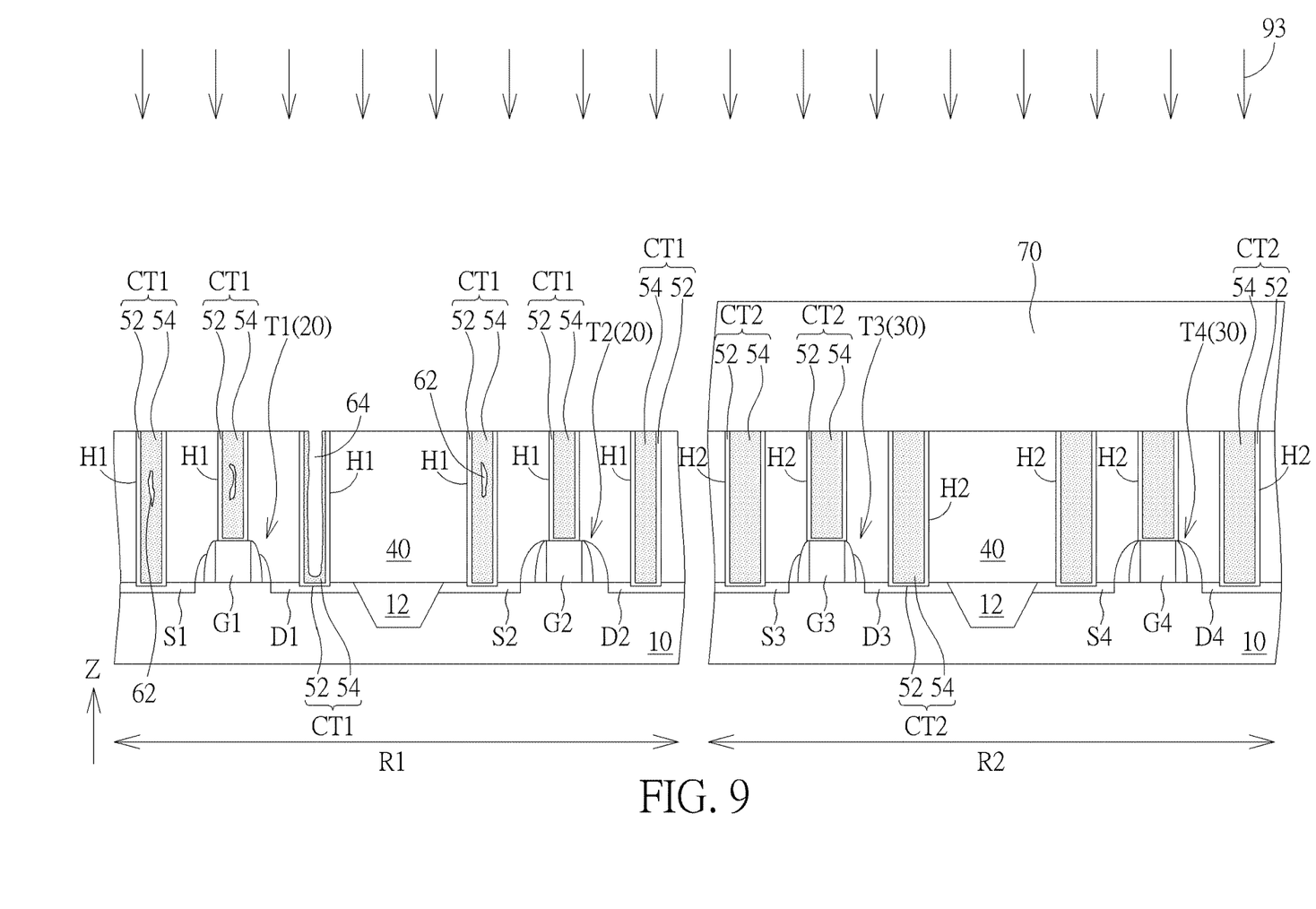

Please refer to FIG. 1, FIG. 3, FIG. 4, FIG. 8 and FIG. 9. FIG. 8 and FIG. 9 are schematic drawings illustrating a manufacturing method of a device for generating a security key according to a second embodiment of the present invention. FIG. 9 is a schematic drawing in a step subsequent to FIG. 8, FIG. 8 may be regarded as a schematic drawing in a step subsequent to FIG. 4, and FIG. 1 may be regarded as a schematic drawing in a step subsequent to FIG. 8. As shown in FIG. 3, FIG. 4, and FIG. 8, in the manufacturing method in this embodiment, the first cleaning process 92 may be performed after the planarization process 91. As shown in FIG. 8 and FIG. 9, a patterned mask layer 70 may be formed covering the second contact structures CT2 after the first cleaning process 92. The patterned mask layer 70 may include a photoresist mask or other suitable materials. Subsequently, a second cleaning process 93 may be performed to the first contact structures CT1 after the first cleaning process 92, and the second contact structures CT2 may be covered by the patterned mask layer 70 during the second cleaning process 93. In some embodiments, the chemicals and/or the process parameters of the second cleaning process 93 may be similar to those of the first cleaning process 92, and the second cleaning process 93 is used to aggravate the second defects 64, but not limited thereto. In some embodiments, the chemicals and/or the process parameters (such as chemical concentrations, process temperature, or process times) of the second cleaning process 93 may be different from those of the first cleaning process 92, and the second defects 64 may be mainly formed by the second cleaning process 93. As shown in FIG. 9 and FIG. 1, the conductive layer 82 and the second dielectric layer 84 may be formed after the second cleaning process 93, and the patterned mask layer 70 may be removed before the steps of forming the conductive layer 82 and the second dielectric layer 84.

Figure 10:
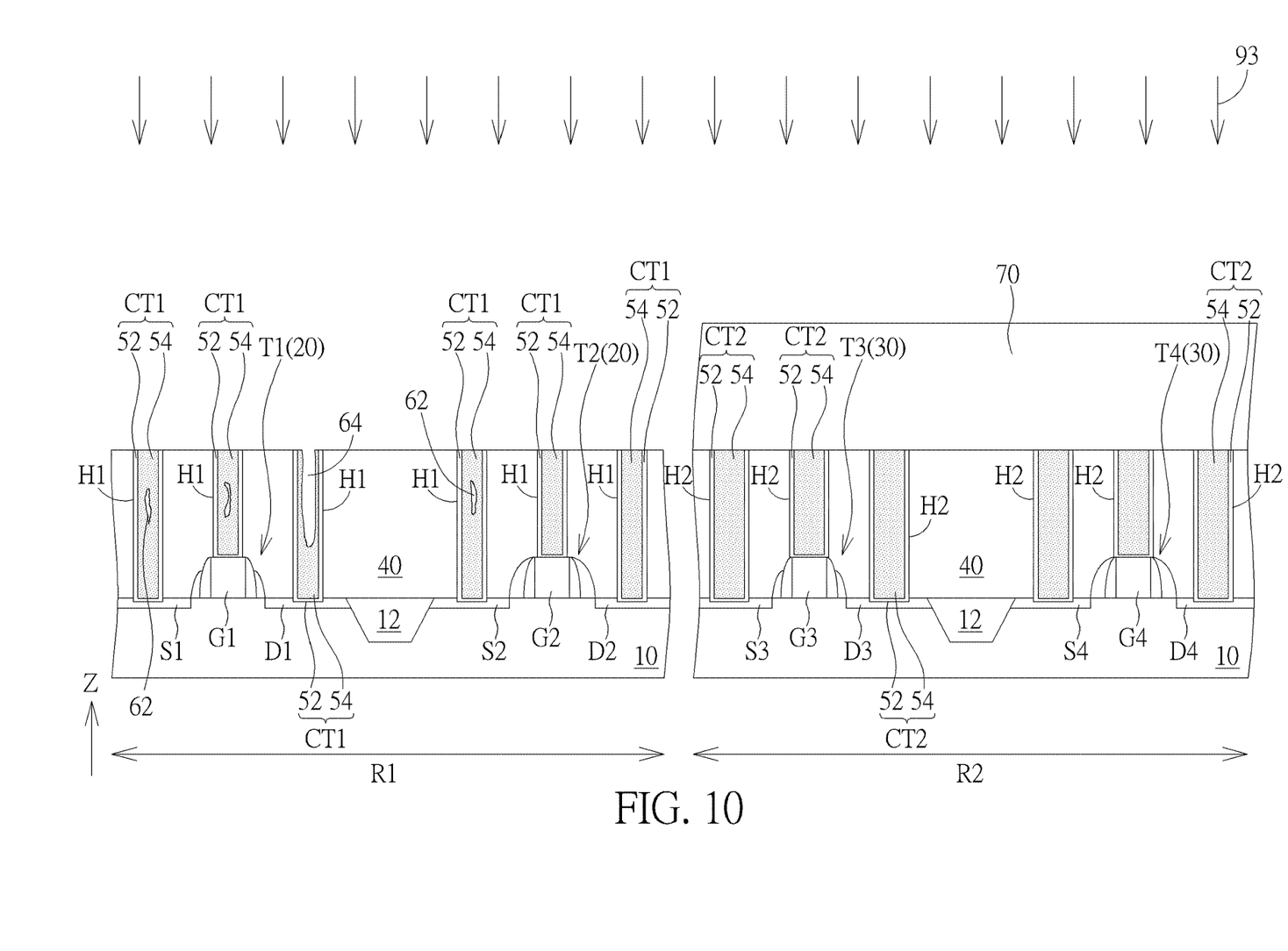
Figure 11:
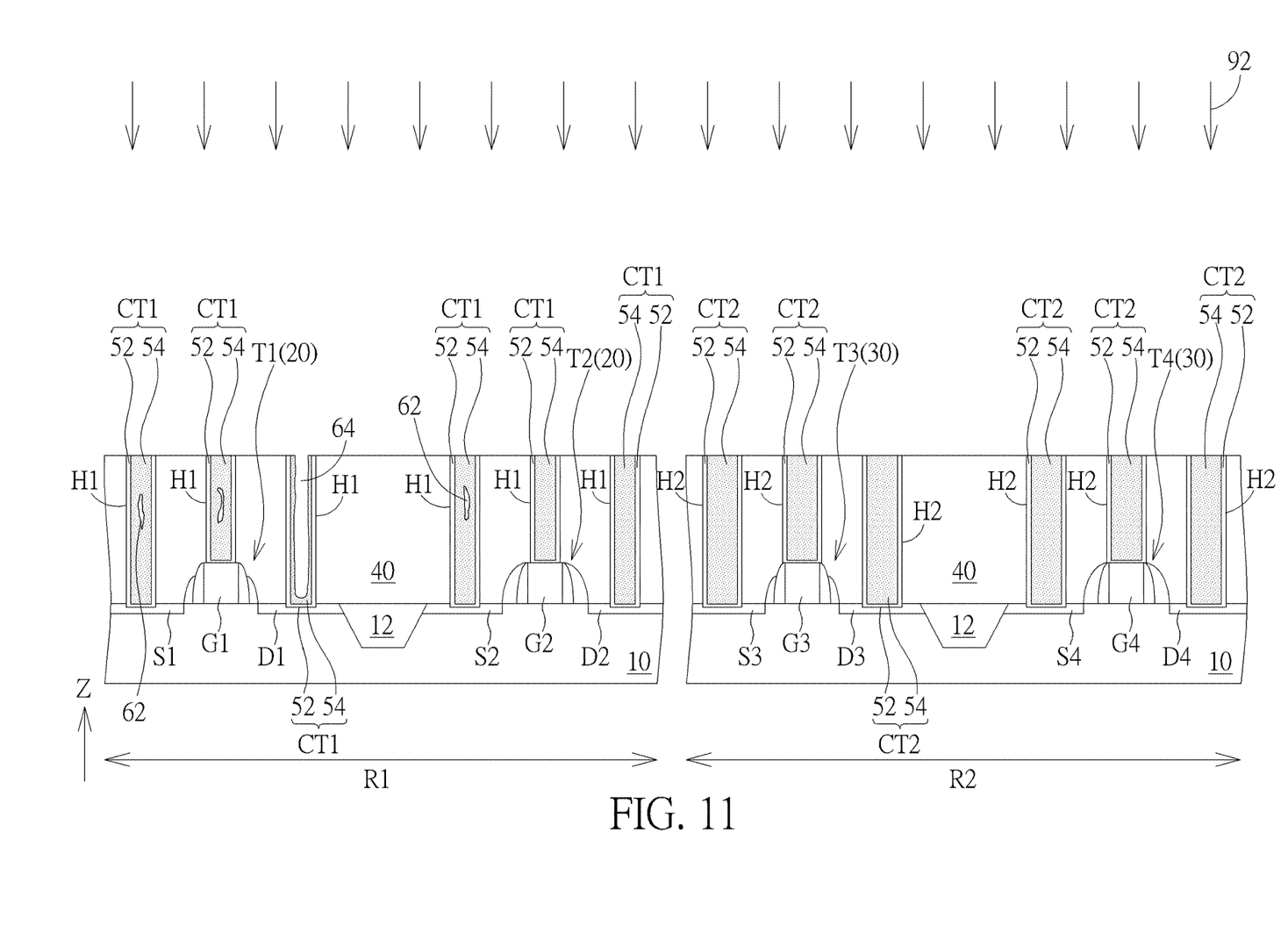

Please refer to FIG. 1, FIG. 3, FIG. 4, FIG. 10 and FIG. 11. FIG. 10 and FIG. 11 are schematic drawings illustrating a manufacturing method of a device for generating a security key according to a third embodiment of the present invention. FIG. 11 is a schematic drawing in a step subsequent to FIG. 10, FIG. 10 may be regarded as a schematic drawing in a step subsequent to FIG. 4, and FIG. 1 may be regarded as a schematic drawing in a step subsequent to FIG. 11. As shown in FIG. 3, FIG. 4, and FIG. 10, in the manufacturing method in this embodiment, the patterned mask layer 70 may be formed covering the second contact structures CT2 after the planarization process 91, and the second cleaning process 93 may be performed to the first contact structures CT1 after the planarization process 93. The second contact structures CT2 may be covered by the patterned mask layer 70 during the second cleaning process 93. As shown in FIG. 10 and FIG. 11, the patterned mask layer 70 may be removed after the second cleaning process 93, and the first cleaning process 92 may be performed after the patterned mask layer 70 is removed. In some embodiments, the first cleaning process 92 may be used to remove byproducts and/or residues generated by the planarization process 91 and residues of the patterned mask layer 70, but not limited thereto. As shown in FIG. 10, FIG. 11 and FIG. 1, the conductive layer 82 and the second dielectric layer 84 may be formed after the first cleaning process 91, and the second defect 64 may be formed by the second cleaning process 93 and be aggravated by the first cleaning process 92.

To summarize the above descriptions, in the device for generating the security key and the manufacturing method thereof according to the present invention, the defects are randomly disposed in at least a part of the contact structures connected with the semiconductor units. The random distribution of the defects in the contact structure may be used as digital biometrics and/or a digital fingerprint that serves as a unique identifier for the electronic device. Accordingly, the semiconductor units and the defects disposed in at least a part of the contact structures connected with the semiconductor units may be used as a physical unclonable function for generating a security key and/or an identification key.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A device for generating a security key, comprising:
a substrate;
semiconductor units disposed on the substrate;
contact structures disposed on and connected with the semiconductor units; and
defects disposed in at least a part of the contact structures randomly, wherein each of the defects comprises an air void disposed in one of the contact structures.

2. The device for generating the security key according to claim 1, wherein each of the contact structures comprises a conductive material, and at least a part of the conductive materials is disposed between one of the air voids and one of the semiconductor units in a thickness direction of the substrate.

3. The device for generating the security key according to claim 1, further comprises:
a conductive layer disposed above the contact structures, wherein the semiconductor units, the contact structures, the defects, and the conductive layer constitute a physical unclonable function (PUF) circuit.

4. The device for generating the security key according to claim 1, wherein the semiconductor units are arranged in an array configuration.

5. The device for generating the security key according to claim 1, wherein each of the semiconductor units comprises a gate electrode, a source region, and a drain region, and each of the contact structures is disposed on one of the gate electrodes, one of the source regions, or one of the drain regions.

6. The device for generating the security key according to claim 5, wherein each of the contact structures directly contacts one of the gate electrodes, one of the source regions, or one of the drain regions.

7. A manufacturing method of a device for generating a security key, comprising:
forming first semiconductor units on a substrate; and
forming first contact structures on the first semiconductor units, wherein the first contact structures are connected with the first semiconductor units, and defects are formed in at least a part of the first contact structures randomly, wherein each of the defects comprises an air void formed in one of the first contact structures.

8. The manufacturing method of the device for generating the security key according to claim 7, further comprises:
forming a conductive layer above the first contact structures, wherein the first semiconductor units, the first contact structures, the defects, and the conductive layer constitute a physical unclonable function (PUF) circuit.

9. The manufacturing method of the device for generating the security key according to claim 7, wherein each of the first semiconductor units comprises a gate electrode, a source region, and a drain region, and each of the first contact structures is formed on one of the gate electrodes, one of the source regions, or one of the drain regions.

10. The manufacturing method of the device for generating the security key according to claim 9, wherein each of the first contact structures directly contacts one of the gate electrodes, one of the source regions, or one of the drain regions.

11. The manufacturing method of the device for generating the security key according to claim 7, further comprising:
forming second semiconductor units on the substrate;
forming a dielectric layer covering the first semiconductor units and the second semiconductor units; and
forming second contact structures on the second semiconductor units, wherein the second contact structures are connected with the second semiconductor units, the first contact structures are formed in first contact holes penetrating the dielectric layer respectively, and the second contact structures are formed in second contact holes penetrating the dielectric layer respectively.

12. The manufacturing method of the device for generating the security key according to claim 11, wherein a projection shape of each of the first contact holes in a thickness direction of the substrate is different from a projection shape of each of the second contact holes in the thickness direction of the substrate.

13. The manufacturing method of the device for generating the security key according to claim 11, wherein a projection area of each of the first contact holes in a thickness direction of the substrate is smaller than a projection area of each of the second contact holes in the thickness direction of the substrate.

14. The manufacturing method of the device for generating the security key according to claim 11, wherein a method for forming the first contact holes and the second contact holes comprises:
- providing a layout pattern comprising first via patterns corresponding to the first contact holes and second via patterns corresponding to the second contact holes;
- performing a first optical proximity correction (OPC) to the first via patterns;
- performing a second OPC to the second via patterns, wherein the first OPC is different from the second OPC;
- outputting the layout pattern to a photomask after the first OPC and the second OPC; and
- performing a patterning process using the photomask for forming the first contact holes and the second contact holes.

15. The manufacturing method of the device for generating the security key according to claim 14, wherein each of the first via patterns is identical to each of the second via patterns before the first OPC and the second OPC.

16. The manufacturing method of the device for generating the security key according to claim 11, wherein a method of forming the first contact structures and the second contact structures comprises:
- forming a conductive material, wherein the conductive material is partly formed in the first contact holes, partly formed in the second contact holes, and partly formed outside the first contact holes and the second contact holes;
- performing a planarization process to the conductive material for removing the conductive material outside the first contact holes and the second contact holes; and
- performing a first cleaning process after the planarization process.

17. The manufacturing method of the device for generating the security key according to claim 16, further comprising:
- forming a patterned mask layer covering the second contact structures after the first cleaning process; and
- performing a second cleaning process to the first contact structures after the first cleaning process, wherein the second contact structures are covered by the patterned mask layer during the second cleaning process.

18. The manufacturing method of the device for generating the security key according to claim 16, further comprising:
- forming a patterned mask layer covering the second contact structures after the planarization process; and
- performing a second cleaning process to the first contact structures after the planarization process, wherein the second contact structures are covered by the patterned mask layer during the second cleaning process, the patterned mask layer is removed after the second cleaning process, and the first cleaning process is performed after the patterned mask layer is removed.

\* \* \* \* \*